(12) United States Patent
Kato et al.

(10) Patent No.: US 6,635,400 B2
(45) Date of Patent: Oct. 21, 2003

(54) RESIST COMPOSITION AND PATTERNING PROCESS

(75) Inventors: Hideto Kato, Gunma-ken (JP); Kazuhiro Nishikawa, Gunma-ken (JP); Yoshinori Hirano, Gunma-ken (JP); Katsuya Takemura, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/835,375

(22) Filed: Apr. 17, 2001

(65) Prior Publication Data

US 2001/0044066 A1 Nov. 22, 2001

(30) Foreign Application Priority Data

Apr. 17, 2000 (JP) ........................................ 2000-115737

(51) Int. Cl.$^7$ .............................. G03F 7/023; G03F 7/30
(52) U.S. Cl. ........................ 430/170; 430/190; 430/191; 430/192; 430/193; 430/270.1; 430/326; 430/330
(58) Field of Search .............................. 430/270.1, 191, 430/190, 192, 193, 326, 330, 170

(56) References Cited

U.S. PATENT DOCUMENTS

| | | | | |
|---|---|---|---|---|
| 5,837,420 A | * | 11/1998 | Aoai et al. ................ | 430/270.1 |
| 5,891,603 A | * | 4/1999 | Kodama et al. .......... | 430/270.1 |
| 5,942,367 A | * | 8/1999 | Watanabe et al. ........... | 430/170 |
| 6,261,738 B1 | * | 7/2001 | Asakura et al. .......... | 430/270.1 |

* cited by examiner

Primary Examiner—John S. Chu
(74) Attorney, Agent, or Firm—Millen, White, Zelano & Branigan, P.C.

(57) ABSTRACT

A resist composition comprising (A) an alkali-insoluble or substantially insoluble polymer having acidic functional groups protected with acid labile groups, which polymer becomes alkali-soluble upon elimination of the acid labile groups, (B) a photoacid generator, and (C) a 1,2-naphthoquinonediazidosulfonyl group-bearing compound has a high resolution and sensitivity, and provides resist patterns of excellent plating resistance when used in UV lithography at an exposure light wavelength of at least 300 nm.

23 Claims, No Drawings

RESIST COMPOSITION AND PATTERNING PROCESS

BACKGROUND OF THE INVENTION

1. Field of the Invention

The present invention relates to a resist composition which provides high sensitivity and high resolution when exposed to ultraviolet light having a wavelength of at least 300 nm. The invention also relates to a patterning process using the resist composition.

2. Prior Art

The thick-film type (3 to 50 μm) resist films employed to form circuit patterns on a substrate by techniques that involve plating are required to have a good pattern profile with vertical walls and a high plating resistance. A resist patterning process which patterns novolac-type resist compositions with an aligner that employs g- or i-line as the light source is commonly used to achieve this end. However, increased light absorption by the resist film on account of its large thickness lowers sensitivity, which in turn reduces throughput during high-volume production.

The drive in recent years toward smaller geometries in circuit patterns has created a need for higher resolutions, yet light absorption by prior-art resist films such as the above has imposed practical limits on the resolution and pattern shape that are achievable.

Also, when novolac-type resist compositions are used for patterning as a plating base, footing often arises at the bottom of the patterned resist and can have an undesirable effect on formation of a metal layer following patterning of the resist. A need has thus been felt for a thick-film type (3 to 50 μm) resist composition which can be patterned in the aligners commonly used today that employ as the light source ultraviolet light such as g- or i-line, which has a high resolution and high sensitivity, and which moreover has a high plating resistance.

SUMMARY OF THE INVENTION

It is therefore an object of the invention to provide a resist composition having a high resolution and a high sensitivity that is suitable for achieving metal film circuit patterns of small geometries. Another object of the invention is to provide a patterning process which uses the resist composition.

We have found that resist compositions comprising (A) an alkali-insoluble or substantially insoluble polymer having acidic functional groups protected with acid labile groups, which polymer becomes alkali-soluble upon elimination of the acid labile groups, (B) a photoacid generator and (C) a 1,2-naphthoquinonediazidosulfonyl group-bearing compound, and comprising also, if necessary, (D) a basic compound and (E) a dissolution promoter, have a high resolution and high sensitivity under UV exposure. On NiFe film substrates, in particular, such resist compositions reduce the problem of footing and make it possible to achieve both a good pattern profile with perpendicular sidewalls and a high resolution.

Especially, the above resist composition is effective as a thick-film type, and imparts a resist film having a high resolution and sensitivity, and a high plating resistance with a good adhesion. In recent years, a highly dense pattern is required for a circuit pattern formed by using a resist composition and a plating technique. Such a highly dense pattern can be formed by narrowing the width of lines in a resist pattern. For ensuring the circuit capacity to the narrow circuit lines, it is necessary to increase the thickness of the circuit lines obtained by plating. For increasing the thickness of the circuit lines, it is required to form a resist film having a high thickness. The inventive resist composition can fully satisfy the above requirements.

Accordingly, the invention provides a resist composition for exposure to ultraviolet light at a wavelength of at least 300 nm, comprising:
(A) an alkali-insoluble or substantially insoluble polymer having acidic functional groups protected with acid labile groups, which polymer becomes alkali-soluble upon elimination of the acid labile groups;
(B) a photoacid generator; and
(C) a 1,2-naphthoquinonediazidosulfonyl group-bearing compound.

Preferably, the polymer (A) contains recurring units of general formula (1) below and has a weight-average molecular weight of 3,000 to 300,000.

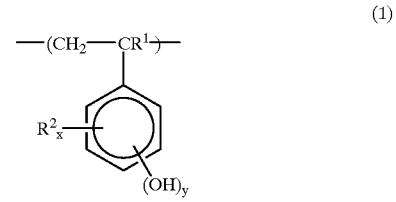

(1)

Herein $R^1$ is hydrogen or methyl, $R^2$ is a straight, branched or cyclic alkyl of 1 to 8 carbons, x is 0 or a positive integer, and y is a positive integer, such that $x+y \leq 5$. In the recurring units, the hydrogen atoms on some of the phenolic hydroxyl groups have been substituted with at least one type of acid labile group, and the amount of acid labile groups averages more than 0 mol %, but not more than 80 mol %, of all the phenolic hydroxyl group hydrogens in formula (1).

The photoacid generator (B) is preferably an oxime sulfonate compound.

The resist composition of the invention may further comprise (D) a basic compound and/or (E) a dissolution promoter.

The dissolution promoter (E) includes a low polynuclear compound of general formula (2) below having phenolic hydroxyl groups and from 2 to 20 benzene rings, such that the ratio in the number of phenolic hydroxyl groups to the number of benzene rings is from 0.5 to 2.5.

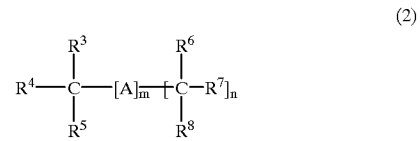

(2)

In formula (2), $R^3$ to $R^8$ are each independently hydrogen, methyl, or a group of formula (3) or (4) below. The letter m is an integer from 0 to 2 and the letter n is an integer from 0 to 2, with the proviso that m is 1 or 2 if n is 0. When m is 1 and n is 0, A is hydrogen, methyl or a group of formula (3). When m is 2 and n is 0, one A moiety is methylene or a group of formula (5) below and the other A moiety is hydrogen, methyl or a group of formula (3). When n is 1, A is methylene or a group of formula (5). When m is 1 and n is 2, A is methine or a group of formula (6) below. When m is 2 and n is 2, one A moiety is methylene or a group of formula (5) and the other A moiety is methine or a group of formula (6).

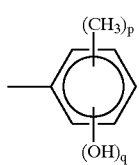
(3)

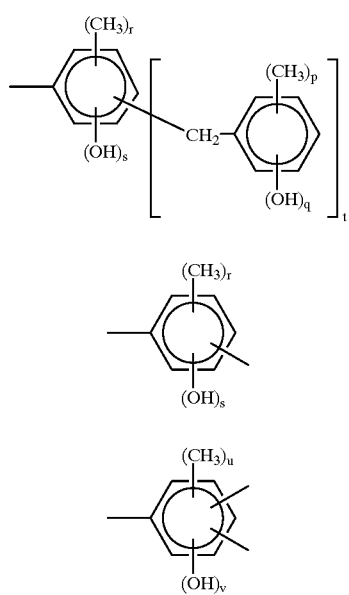
(4)

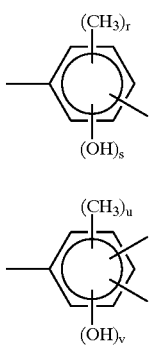
(5)

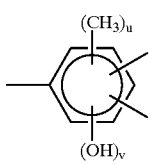
(6)

In formulas (3) to (6), p, q, r, s, t, u and v are each an integer from 0 to 3, such that $p+q \leq 5$, $r+s \leq 4$ and $u+v \leq 3$.

In a second aspect, the invention provides a patterning process comprising the steps of (i) applying the above-described resist composition onto a substrate; (ii) heat treating the applied resist composition, then exposing it through a photomask to ultraviolet light having a wavelength of at least 300 nm; and (iii) heat treating the exposed resist composition if necessary, then developing it with a developer. In this case, the thickness of the resist film formed on the substrate is preferably 3 to 50 μm.

DETAILED DESCRIPTION OF THE INVENTION

The resist composition of the invention is based on (A) a polymer or high molecular weight compound which is insoluble or substantially insoluble in alkali, has acidic functional groups protected by acid labile groups, and becomes alkali-soluble when the acid labile groups are eliminated. The polymer typically has a weight-average molecular weight of 3,000 to 300,000, and preferably 3,000 to 30,000, and contains recurring units of general formula (1) below.

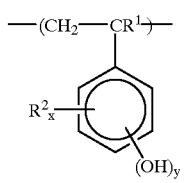
(1)

In formula (1), $R^1$ is hydrogen or methyl, and $R^2$ is a straight, branched or cyclic alkyl of 1 to 8 carbons. The letter x is 0 or a positive integer and y is a positive integer, such that $x+y \leq 5$. The hydrogen atoms on some of the phenolic hydroxyl groups in the recurring units of formula (1) have been replaced with one or more type of acid labile group. The amount of acid labile groups averages more than 0 mol %, but not more than 80 mol %, and preferably from 10 to 50 mol %, of all the phenolic hydroxyl group hydrogens in formula (1).

Any of various acid labile groups may be selected for use in the polymer. Exemplary acid labile groups include groups of the following general formulas (7) and (8), tertiary alkyl groups, trialkylsilyl groups, and ketoalkyl groups.

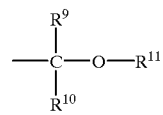
(7)

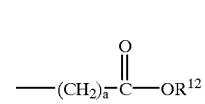
(8)

In formula (7), $R^9$ and $R^{10}$ are each independently a hydrogen or a straight or branched alkyl of 1 to 6 carbons, and $R^{11}$ is a straight, branched or cyclic alkyl of 1 to 10 carbons. Alternatively, a pair of $R^9$ and $R^{10}$, a pair of $R^9$ and $R^{11}$, or a pair of $R^{10}$ and $R^{11}$ may together form a ring, in which case $R^9$, $R^{10}$ and $R^{11}$ are each independently a straight or branched alkylene of 1 to 6 carbons.

Specific examples of formula (7) groups include straight or branched acetal groups such as 1-ethoxyethyl, 1-n-propoxyethyl, 1-isopropoxyethyl, 1,-n-butoxyethyl, 1-isobutoxyethyl, 1-sec-butoxyethyl, 1-tert-butoxyethyl, 1-tert-amyloxyethyl, 1-ethoxy-n-propyl and 1-cyclohexyloxy-ethyl; and cyclic acetal groups such as tetrahydrofuranyl. Of these, 1-ethoxyethyl and 1-ethoxy-n-propyl are preferred.

In formula (8), $R^{12}$ is a tertiary alkyl of 4 to 12 carbons, preferably 4 to 8 carbons, and most preferably 4 to 6 carbons. The letter a is an integer from 0 to 6.

Specific examples of formula (8) groups include tert-butoxycarbonyl, tert-butoxycarbonylmethyl, tert-amyloxycarbonyl and tert-amyloxycarbonylmethyl.

Illustrative examples of tertiary alkyl groups that may be used as the acid labile groups include tert-butyl, tert-amyl and 1-methylcyclohexyl.

Illustrative examples of trialkylsilyl groups that may be used as the acid labile groups include those in which each alkyl group has 1 to 6 carbons, such as trimethylsilyl, triethylsilyl and dimethyl-tert-butylsilyl. Illustrative examples of ketoalkyl groups include 3-oxocyclohexyl and the groups having the following formulas.

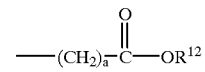

Suitable photoacid generators (B) include oxime sulfonate compounds, onium salts, β-ketosulfone derivatives, diazomethane derivatives, disulfone derivatives, sulfonic acid ester derivatives and imidoyl sulfonate derivatives. Of these, oxime sulfonate compounds are preferred.

Specific examples of suitable oxime sulfonate compounds include α-(p-toluenesulfonyloxyimino)phenylacetonitrile, α-(p-chlorobenzenesulfonyloxyimino)phenylacetonitrile, α-(4-nitrobenzenesulfonyloxyimino)phenylacetonitrile, α-(4-nitro-2-trifluoromethylbenzenesulfonyl-oxyimino) phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzene-sulfonyloxyimino)-4-methoxyphenylacetonitrile, α-(benzenesulfonyloxyimino)-2-thienylphenylacetonitrile, α-(4-dodecylbenzenesulfonyloxyimino)phenylacetonitrile, α-(4-toluenesulfonyloxyimino)-4-methoxyphenylacetonitrile, α-(4-dodecylbenzenesulfonyloxyimino)-4-methoxyphenylacetonitrile and α-(4-toluenesulfonyloxyimino)-3-thienylacetonitrile.

Specific examples of suitable onium salts include diphenyliodonium trifluoromethanesulfonate, (p-tert-butoxyphenyl)iodonium trifluoromethanesulfonate, diphenyliodonium p-toluenesulfonate, (p-tert-butoxyphenyl) iodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)-phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenyl-sulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate and dicyclohexylphenylsulfonium p-toluenesulfonate.

Illustrative examples of β-ketosulfone derivatives include 2-cyclohexylcarbonyl-2-(p-toluenesulfonyl)propane and 2-isopropylcarbonyl-2-(p-toluenesulfonyl)propane.

Illustrative examples of diazomethane derivatives include bis(benzenesulfonyl)diazomethane, bis(cyclohexylsulfonyl) diazomethane and bis(tert-butylsulfonyl)diazomethane.

Specific examples of disulfone derivatives include diphenyl disulfone and dicyclohexyl disulfone. Specific examples of sulfonic acid ester derivatives include 1,2,3-tris (methanesulfonyloxy)benzene, 1,2,3-tris (trifluoromethanesulfonyloxy)benzene) and 1,2,3-tris(p-toluenesulfonyloxy)benzene. Specific examples of imidoyl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate and 5-norbornene-2,3-dicarboxyimidoyl n-butylsulfonate.

The photoacid generator is added in an amount of preferably 0.5 to 15 parts, and especially 1 to 8 parts, per 80 parts of the polymer (A) (all parts here and below are by weight). At less than 0.5 part, the sensitivity tends to be poor. On the other hand, the addition of more than 15 parts may lower the resolution of the resist composition and result in the presence of excess monomer, possibly reducing the heat resistance of the composition.

The 1,2-naphthoquinonediazidosulfonyl group-bearing compound (C) in the inventive resist composition is exemplified by compounds which contain on the molecule the 1,2-naphthoquinonediazidosulfonyl group of general formula (9) or (10) below.

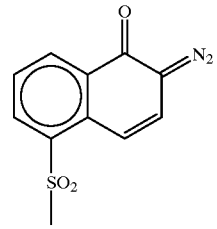

(9)

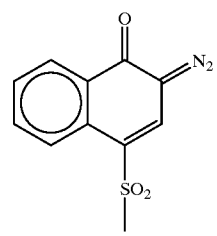

(10)

Preferred examples of the compounds into which a 1,2-naphthoquinonediazidosulfonyl group can be introduced include trihydroxybenzophenones, tetrahydroxybenzophenones, phenolic hydroxyl group-bearing ballast molecules of general formula (2) below, and novolac resins comprising recurring units of formula (11) below and having a weight-average molecular weight in a range of 2,000 to 20,000, and preferably 3,000 to 10,000.

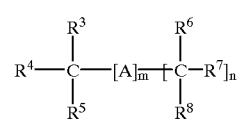

(2)

In above formula (2), $R^3$ to $R^8$ are each independently hydrogen, methyl, or a group of formula (3) or (4) below. The letter m is an integer from 0 to 2, and the letter n is an integer from 0 to 2, with the proviso that m is 1 or 2 if n is 0. When m is 1 and n is 0, A is hydrogen, methyl or a group of formula (3). When m is 2 and n is 0, one A moiety is methylene or a group of formula (5) below and the other A moiety is hydrogen, methyl or a group of formula (3). When n is 1, A is methylene or a group of formula (5). When m is 1 and n is 2, A is methine or a group of formula (6) below. When m is 2 and n is 2, one A moiety is methylene or a group of formula (5) and the other A moiety is methine or a group of formula (6).

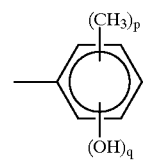

(3)

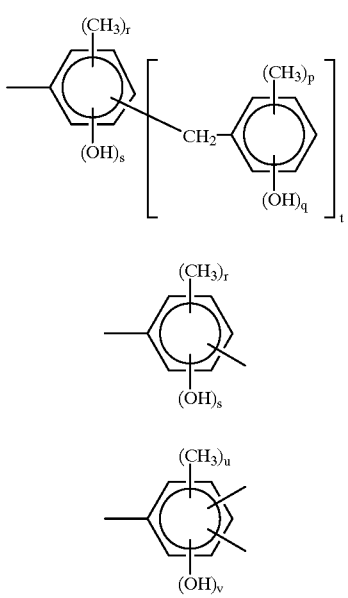

(4)

(5)

(6)

In formulas (3) to (6), p, q, r, s, t, u and v are each an integer from 0 to 3, such that $p+q \leq 5$, $r+s \leq 4$ and $u+v \leq 3$.

The preferred ballast molecule of formula (2) above is a low polynuclear compound which generally contains from 2 to 20, preferably 2 to 10, and most preferably 3 to 6, benzene rings. The ratio in the number of phenolic hydroxyl groups to the number of benzene rings is from 0.5 to 2.5, preferably from 0.7 to 2.0, and most preferably from 0.8 to 1.5.

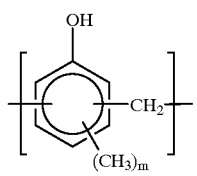

(11)

Herein, m is an integer from 0 to 3.

The novolac resin comprising recurring groups of formula (11) can be prepared by using a conventional process to effect condensation between at least one phenol of formula (12) below and an aldehyde.

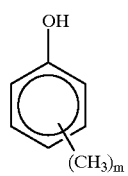

(12)

In formula (12), m is an integer from 0 to 3. Specific examples of the phenol include o-cresol, m-cresol, p-cresol and 3,5-xylenol. Specific examples of the aldehyde include formaldehyde, paraformaldehyde, acetaldehyde and benzaldehyde. Formaldehyde is preferred.

The molar ratio of the phenol of formula (12) to the aldehyde is preferably from 0.2 to 2, and especially from 0.3 to 2.

The method of introducing 1,2-naphthoquinonediazidosulfonyl groups into the above compounds preferably involves a dehydrochlorination condensation reaction between 1,2-naphthoquinonediazidosulfonyl chloride and a phenolic hydroxyl group in the presence of a basic catalyst. If the starting compound is a ballast molecule of formula (2), a trihydroxybenzophenone or a tetrahydroxybenzophenone, the proportion of the phenolic hydroxyl group hydrogens that are substituted with 1,2-naphthoquinonediazidosulfonyl groups is preferably 10 to 100 mol %, and especially 50 to 100 mol %. If the starting compound is a novolac resin of formula (11), the proportion of the phenolic hydroxyl group hydrogens that are substituted with 1,2-naphthoquinonediazidosulfonyl groups is preferably 2 to 50 mol %, and especially 3 to 27 mol %.

The amount of the 1,2-naphthoquinonediazidosulfonyl group-bearing compound included in the resist composition of the invention is preferably from 0.1 to 15 parts, and especially from 0.5 to 10 parts, per 80 parts of the polymer (A). At less than 0.1 part, the resist composition may have too low a resolution, whereas the presence of more than 15 parts tends to reduce the sensitivity.

The basic compounds (D) are desirably those capable of suppressing the rate at which the acid generated by the photoacid generator diffuses within the resist film. The incorporation of such a basic compound within the resist composition holds down the rate of acid diffusion within the resist film, resulting in better resolution and suppressing changes in sensitivity following exposure. In addition, it reduces the dependence of the process on substrate and environmental factors, and improves the exposure latitude and the pattern profile.

Suitable basic compounds (D) include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives and imide derivatives.

Examples of suitable primary aliphatic amines include ammonia, methylamine, ethylamine, n-propylamine, iso-butylamine, sec-butylamine and tert-butylamine. Examples of suitable secondary aliphatic amines include dimethylamine, diethylamine, di-n-propylamine, di-iso-propylamine, di-n-butylamine, di-iso-butylamine and di-sec-butylamine. Examples of suitable tertiary aliphatic amines include trimethylamine, triethylamine, tri-n-propylamine, tri-iso-propylamine, tri-n-butylamine, tri-iso-butylamine and tri-sec-butylamine.

Suitable mixed amines include dimethylethylamine, methylethylpropylamine, benzylamine, phenethylamine and benzyldimethylamine. Suitable aromatic and heterocyclic amines include aniline, N,N-dimethylaniline, pyridine, quinoline and 1,8-diazabicycloundecene.

Suitable carboxyl group-bearing nitrogenous compounds include aminobenzoic acid, indolecarboxylic acid, nicotinic acid and alanine. Suitable sulfonyl group-bearing nitrogenous compounds include 3-pyridinesulfonic acid and pyridinium p-toluenesulfonate.

Suitable hydroxyl group-bearing nitrogenous compounds, hydroxyphenyl group-bearing nitrogenous compounds and alcoholic nitrogenous compounds include 2-hydroxypyridine, aminocresol, 2,4-quinolinediol, 3-indolemethanol hydrate, triethanolamine, N-ethyldiethanolamine and piperidine ethanol.

Suitable amide derivatives include formamide, N-methylformamide, N,N-dimethylformamide, acetamide, N-methylacetamide, N,N-dimethylacetamide, propionamide and benzamide. Suitable imide derivatives include phthalimide, succinimide and maleimide.

The basic compound may be used singly or in combinations of two or more thereof, and is typically included in an amount of 0 to 2 parts, and preferably 0.01 to 1 part, per 80 parts of the polymer (A). The use of more than 2 parts may result in too low a sensitivity.

The dissolution promoter (E) is typically a low polynuclear compound of formula (2) above which has phenolic hydroxyl groups and from 2 to 20, preferably from 2 to 10, and most preferably from 3 to 6, benzene rings. The ratio in the number of phenolic hydroxyl groups to the number of benzene rings in the compound is 0.5 to 2.5, preferably from 0.7 to 2.0, and most preferably from 0.8 to 1.5.

Specific examples of suitable low polynuclear compounds include those shown below.

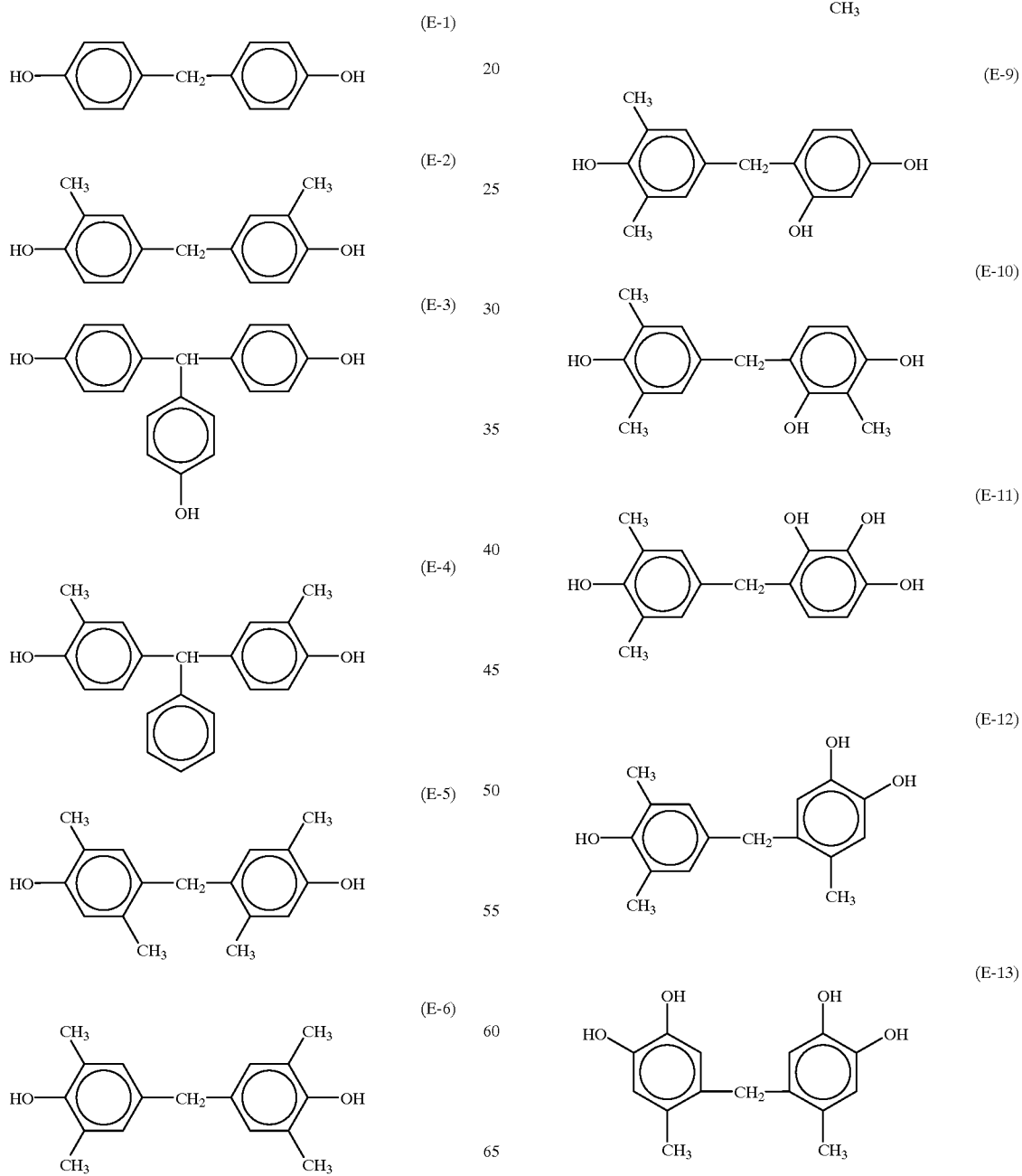

(E-14)
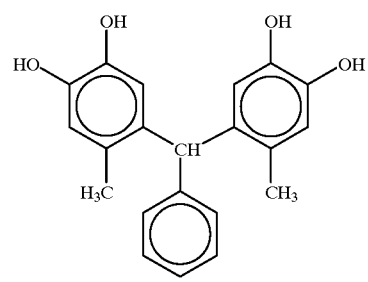
(E-15)
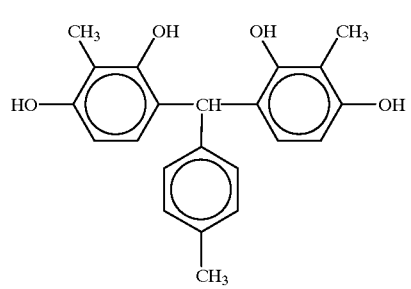
(E-16)
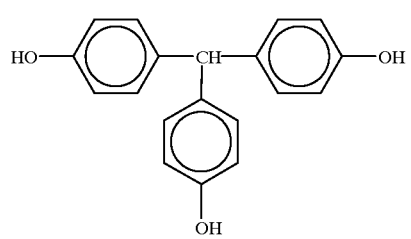
(E-17)
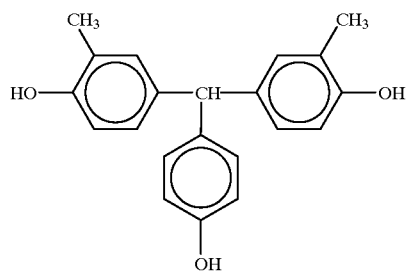
(E-18)
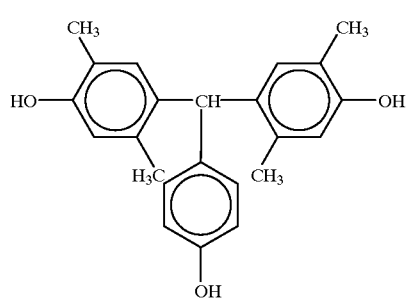
(E-19)
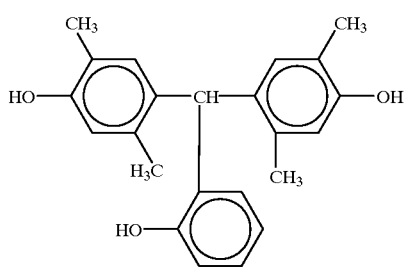
(E-20)
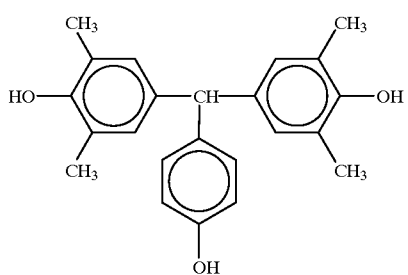
(E-21)
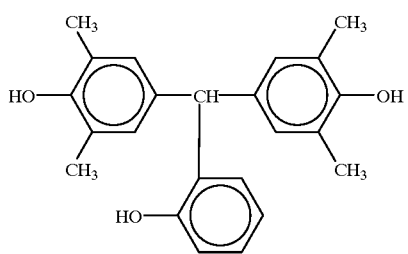
(E-22)
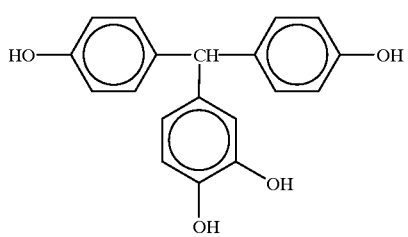
(E-23)
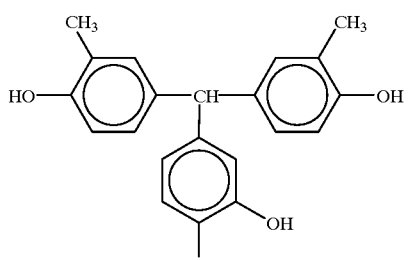
(E-24)
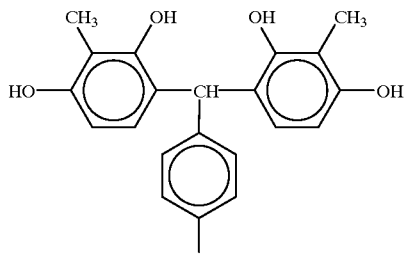

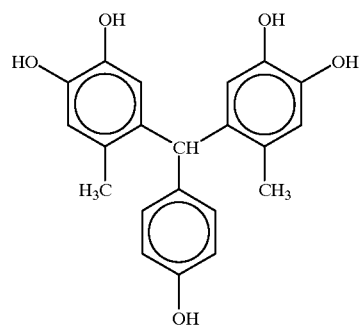
(E-25)
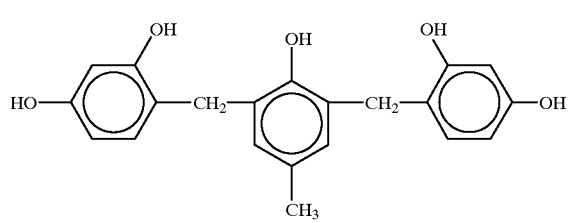
(E-26)
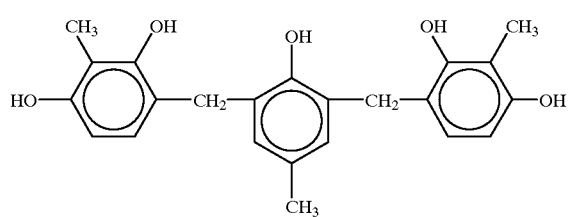
(E-27)
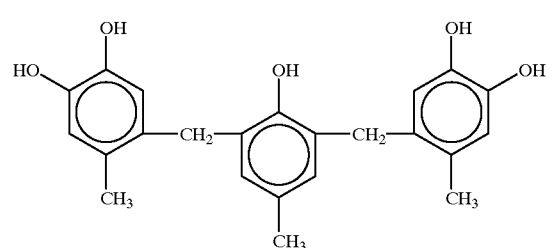
(E-28)
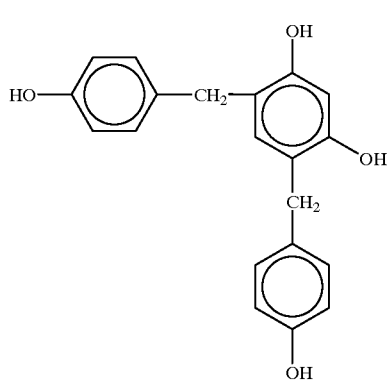
(E-29)
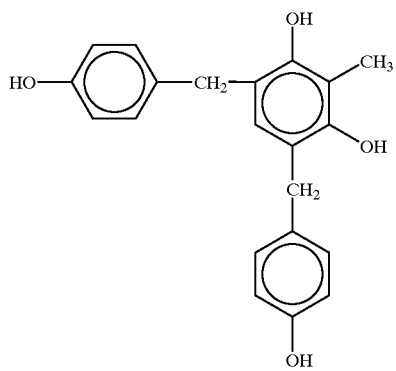
(E-30)
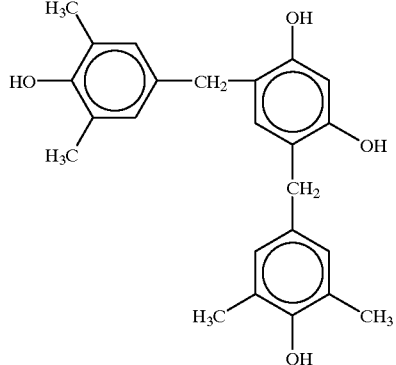
(E-31)
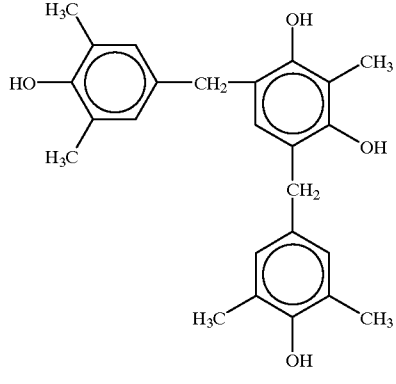
(E-32)
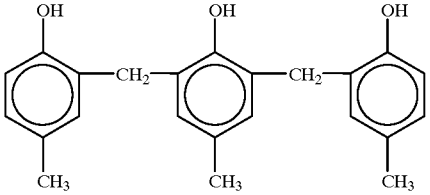
(E-33)
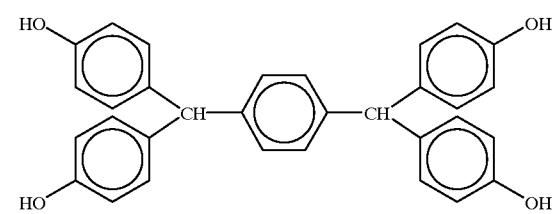
(E-34)

(E-35) 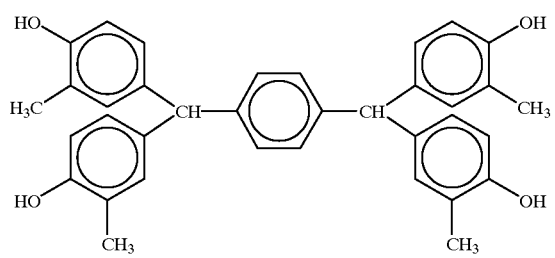
(E-36) 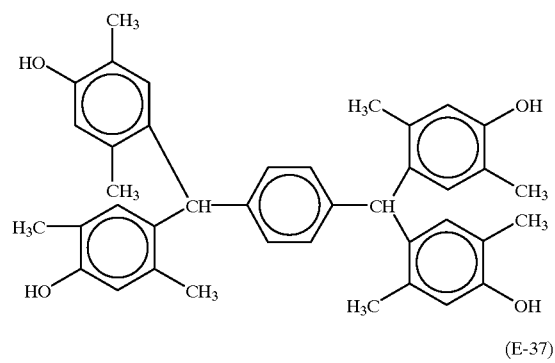
(E-37) 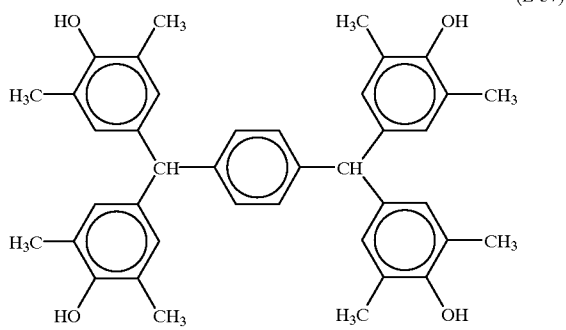
(E-38) 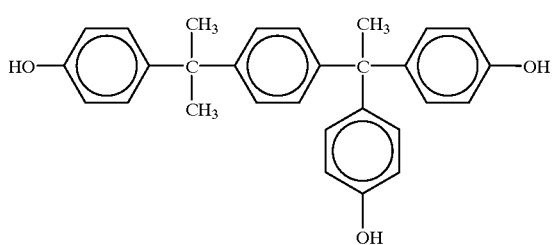
(E-39) 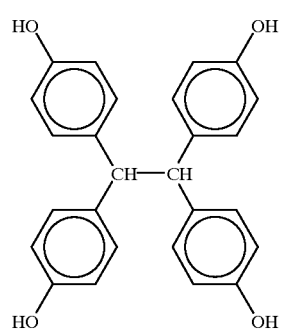
(E-40) 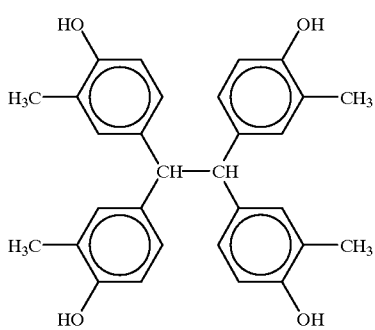
(E-41) 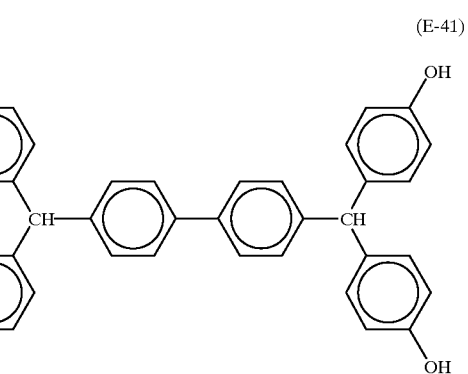
(E-42) 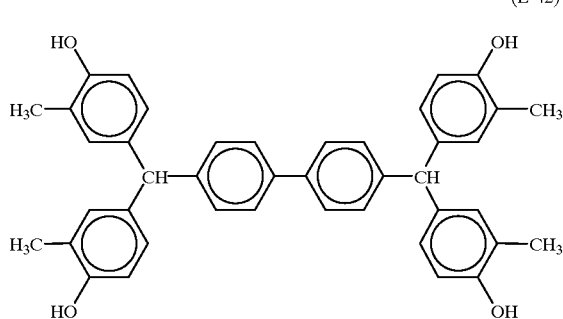
(E-43) 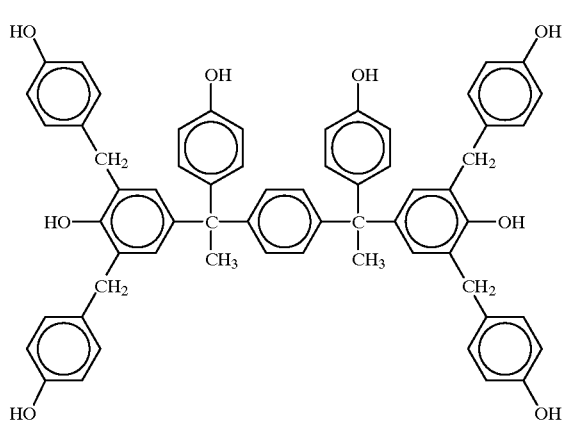

-continued

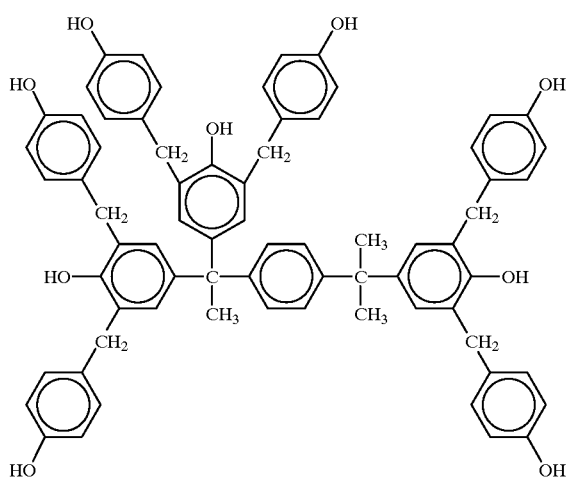
(E-44)

The dissolution promoter may be used singly or as combinations of two or more thereof, and is typically included in an amount of 0 to 10 parts, and preferably 0.05 to 5 parts, per 80 parts of the polymer (A). The use of more than 10 parts may lower the resolution and thermal stability of the resist.

Organic solvents that may be used in the resist composition of the invention include ketones such as cyclohexanone, 2-heptanone, 3-heptanone and 4-heptanone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, propylene glycol dimethyl ether, diethylene glycol dimethyl ether, ethylene glycol tert-butyl ether methyl ether (1-tert-butoxy-2-methoxyethane) and ethylene glycol tert-butyl ether ethyl ether (1-tert-butoxy-2-ethoxyethane); and esters such as propylene glycol monomethyl ether acetate, propylene glycol monoethyl ether acetate, ethyl lactate, ethyl pyruvate, butyl acetate, methyl-3-methoxypropionate, ethyl-3-ethoxypropionate, tert-butyl acetate, tert-butyl propionate and methyl β-methoxyisobutyrate. Of the above, preferred organic solvents include 1-ethoxy-2-propanol, in which the resist components have an excellent solubility, and propylene glycol monomethyl ether acetate (both the α- and β-forms), in which the resist components have both an excellent solubility and an excellent stability. Any one or combinations of two or more of the above organic solvents may be used.

The organic solvent is added in an amount of preferably 90 to 600 parts, and especially 100 to 500 parts, per 80 parts of the polymer (A).

The resist composition of the invention also may include, as optional ingredients, a surfactant which is commonly used for improving the coating characteristics, and a light-absorbing material for reducing reflection and backscatter from the substrate. The optional ingredients may be added in conventional amounts insofar as this does not compromise the objects of the invention.

The surfactant is preferably a nonionic surfactant, examples of which include perfluoroalkyl polyoxyethylene ethanols, fluorinated alkyl esters, perfluoroalkylamine oxides and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403 and DS-451 from Daikin Industries Ltd., Megaface F-8151 from Dainippon Ink & Chemicals, Inc., and X-70-092 and X-70-093 from Shin-Etsu Chemical Co., Ltd.

Suitable examples of the light-absorbing material include azo compounds such as 2-benzeneazo-4-methylphenol and 4-hydroxy-4'-dimethylaminoazobenzene, and curcumin.

In patterning with the resist composition of the invention, the resist composition is first applied to a substrate by a known technique. The type of substrate is not critical, although the invention is especially effective on a NiFe film substrate. The thickness of the resist film is preferably from 1 to 50 µm, preferably 3 to 50 µm, more preferably from 3 to 30 µm, and most preferably from 3 to 10 µm. Next, the applied resist film is preferably heated at 90 to 130° C. for a period of 1 to 10 minutes, following which it is exposed to light through a photomask. In the practice of the invention, exposure is carried out using ultraviolet light having a wavelength of at least 300 nm. The exposure dose is not critical, although a dose of 1 to 1,000 mJ/cm², and especially 10 to 500 mJ/cm², is preferred. Following exposure, the resist may be heat-treated if necessary at 100 to 130° C. for 1 to 5 minutes, after which development is carried out with a developer. Examples of developers that may be used for this purpose include aqueous solutions of organic alkalis such as tetramethylammonium hydroxide (TMAH) and aqueous solutions of inorganic alkalis such as sodium hydroxide, potassium hydroxide or potassium metaborate. This process yields a positive pattern. Thereafter, a metal plating such as copper, gold or magnetic metal plating including Fe, Ni or Co plating is conducted on the substrate.

The resist composition of the invention has a high resolution and a high sensitivity, particularly when exposed to ultraviolet light having a wavelength of at least 300 nm. Use of the inventive resist composition enables the formation of a pattern having excellent plating resistance.

EXAMPLES

The following synthesis examples, examples of the invention and comparative examples are provided by way of illustration and not by way of limitation. All parts are by weight.

Synthesis Examples 1 and 2

Synthesis of Novolac Resins

A three-neck flask equipped with a stirrer, a condenser and a thermometer was charged with 64.8 g (0.60 mole) of p-cresol, 162.3 g (1.50 mole) of m-cresol, 110.1 g (0.90 mole) of 3,5-xylenol, 133.8 g (1.65 mole) of 37 wt % formaldehyde in water and 0.90 g ($7.2 \times 10^{-3}$ mole) of oxalic acid dihydrate as the polycondensation catalyst. While the flask was immersed in an oil bath to keep the internal temperature at 100° C., polycondensation was carried out for 1 hour.

Following reaction completion, 1,500 ml of methyl isobutyl ketone (MIBK) was added and the flask contents were stirred for 30 minutes. The aqueous phase was discarded, after which the product extracted into the MIBK phase was washed five times with 900 ml of deionized water and the wash water was discarded each time. The solution was then vacuum stripped at 4 mmHg and 150° C. in an evaporator, giving 245 g of novolac resin A-1.

A novolac resin A-2 was prepared in the same way as novolac resin A-1, using the starting phenols shown in Table 1 and formaldehyde.

TABLE 1

| Synthesis example | Novolac resin | p-Cresol (mol %) | m-Cresol (mol %) | 3,5-Xylenol (mol %) | Mw |
|---|---|---|---|---|---|
| 1 | A-1 | 20 | 50 | 30 | 6,000 |
| 2 | A-2 | 60 | 40 | — | 3,000 |

Synthesis Examples 3 to 5

Synthesis of 1,2-Naphthoquinonediazidosulfonyl Group-bearing Novolac Resins

The following procedure was carried out under darkened conditions. A three-neck flask equipped with a stirrer, a dropping funnel and a thermometer was charged with 150 g (1.2 mole) of novolac resin A-1 (hydroxyl equivalent weight, 124.4), 19.3 g (0.072 mole) of 1,2-naphthoquinone-2-diazido-5-sulfonyl chloride and 760 g of 1,4-dioxane, and the flask contents were stirred to effect dissolution. Next, 8.0 g (0.079 mole) of triethylamine was added dropwise to the solution. Following the completion of addition, stirring was continued for 10 hours, after which the mixture was poured into a large volume of 0.12 N hydrochloric acid and the resin that precipitated out was recovered. The resin was dissolved in 600 g of ethyl acetate, washed three times with 200 g of water and the wash water discarded each time. The solution was then vacuum stripped at 40° C., giving 140 g of the 1,2-naphthoquinone-2-diazido-5-sulfonyl group-bearing novolac resin C-1 shown in Table 2.

Using the starting materials shown in Table 2, 1,2-naphthoquinone-2-diazido-5-sulfonyl group-bearing novolac resins C-2 and C-3 were prepared in the same way.

TABLE 2

| Synthesis example | NQD group-bearing novolac resin | Novolac resin | NQD group content (mol %) |
|---|---|---|---|
| 3 | C-1 | A-1 | 6 |
| 4 | C-2 | A-1 | 15 |
| 5 | C-3 | A-2 | 10 |

Note) NQD group: 1,2-naphthoquinone-2-diazido-5-sulfonyl group

EXAMPLES

Comparative Examples

The following constituents were uniformly dissolved in the respective organic solvents shown in Tables 3 and 4 below: a base resin of one of the formulas given below (Polym-1, 2 or 3) or above novolac resin A-1, a photoacid generator (PAG-1), a 1,2-naphthoquinondiazidosulfonyl group-bearing compound of any one of formulas C-1 to C-3 above or formulas C-4 to C-6 below, the dissolution promoter of formula E-16 or E-34 below, the basic compound shown in Tables 3 and 4, and 0.1 part of the surfactant Florade FC-430. The resulting solutions were passed through a membrane filter having a pore size of 0.2 μm, thereby giving resist solutions.

The resist solutions were spin-coated onto a NiFe Permalloy substrate, then soft-baked on a hot plate at 120° C. for 300 seconds to form a 6.0 μm thick resist film.

Next, the resist film was exposed through a reticle using an i-line stepper (NSR-1755i7A, from Nikon Corporation; NA=0.50), and post-exposure baked at 100° C. for 120 seconds. The resist film was then developed for 300 seconds with a 2.38% by weight aqueous solution of tetramethylammonium hydroxide, rinsed with deionized water and dried, giving a positive pattern.

In the resist patterns thus obtained, the optimal exposure dose (sensitivity: Eop) was defined as the dose at which resolution is achieved in a 1:1 array of 3.0 μm lines and spaces. The resolution of the resist under evaluation was defined as the minimum line width of the lines and spaces at which there is no film loss at the top of the pattern and the bottom areas of the pattern are separated. The resist compositions were formulated as shown in Tables 3 and 4. Evaluation results for the resist compositions prepared in the examples according to the invention are shown in Table 5, and evaluation results for the resist compositions in the comparative examples are shown in Table 6.

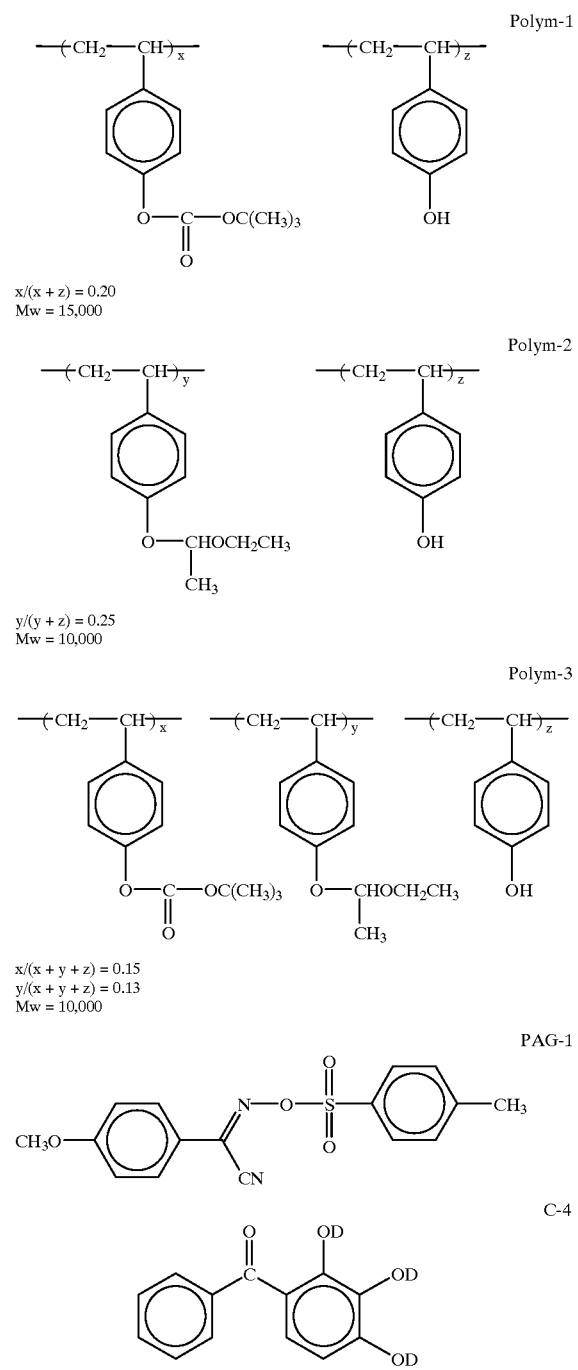

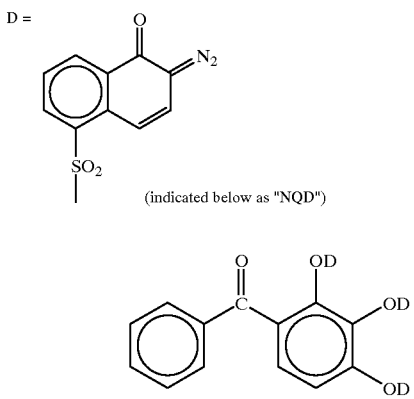

D = (indicated below as "NQD")

(D is H or NQD)
[NQD]/[D] = 0.60

(D is H or NQD)
[NQD]/[D] = 0.60

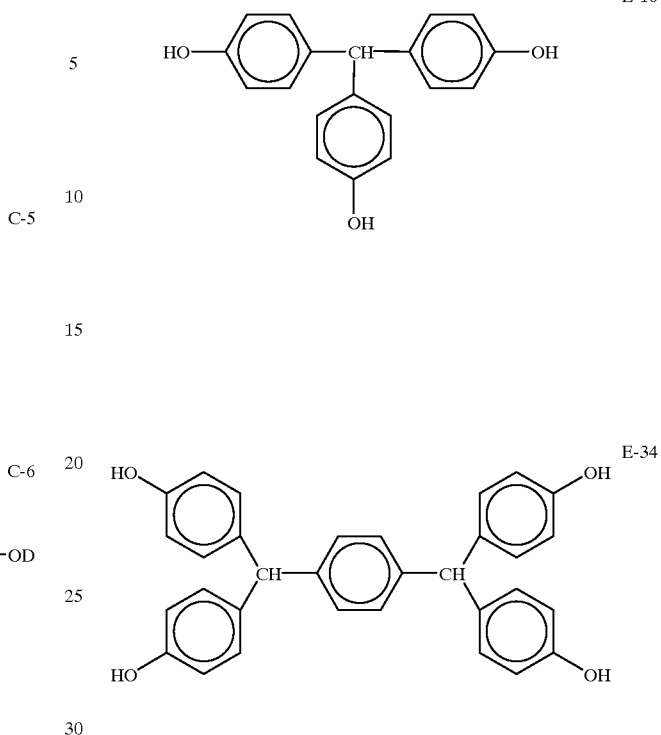

TABLE 3

(amounts are shown in parts by weight)

| Example | Base resin | Photoacid generator | Photo-sensitizer | Basic compound | Additives | Organic solvent |
|---|---|---|---|---|---|---|
| 1 | Polym-1 (80) | PAG-1 (2.0) | C-4 (1.0) | NMP (0.20) | | PGMEA (150) |
| 2 | Polym-1 (80) | PAG-1 (2.0) | C-5 (1.5) | TEA (0.15) | | EL/BA (150) |
| 3 | Polym-1 (80) | PAG-1 (2.0) | C-6 (2.0) | TEA (0.15) | E-34 (3.0) | PGMEA (150) |
| 4 | Polym-2 (80) | PAG-1 (2.0) | C-5 (2.0) | TEA (0.15) | | PGMEA (150) |
| 5 | Polym-2 (80) | PAG-1 (2.0) | C-6 (1.5) | NMP (0.15) | | EL/BA (150) |
| 6 | Polym-2 (80) | PAG-1 (1.5) | C-2 (2.0) | TEA (0.15) | E-16 (3.0) | PGMEA (150) |
| 7 | Polym-2 (80) | PAG-1 (2.0) | C-1 (1.0) C-4 (1.0) | TEA (0.15) | | PGMEA (150) |
| 8 | Polym-3 (80) | PAG-1 (2.0) | C-4 (2.0) | TEA (0.15) | | PGMEA (150) |
| 9 | Polym-3 (80) | PAG-1 (2.0) | C-5 (2.0) | TEA (0.15) | E-16 (3.0) | PGMEA (150) |
| 10 | Polym-3 (80) | PAG-1 (2.0) | C-3 (3.0) | TEA (0.10) | | EL/BA (150) |

TEA: triethanolamine
NMP: N-methylpyrrolidone
PGMEA: propylene glycol monomethyl ether acetate
EL/BA: a 85/15 mixture of ethyl lactate/butyl acetate

TABLE 4

(amounts are shown in parts by weight)

| Comparative Example | Base resin | Photoacid generator | Photo-sensitizer | Basic compound | Additives | Organic solvent |
|---|---|---|---|---|---|---|
| 1 | Polym-1 (80) | PAG-1 (2.0) | | TEA (0.15) | | PGMEA (150) |
| 2 | Polym-1 (80) | PAG-1 (2.0) | C-6 (2.0) | | | PGMEA (150) |
| 3 | A-1 (80) | | C-5 (15.0) | | | EL/BA (150) |

TABLE 5

| Example | Sensitivity $E_{OD}$ (mJ/cm$^2$) | Resolution ($\mu$m) | Profile |
|---|---|---|---|
| 1 | 40 | 1.0 | rectangular |
| 2 | 90 | 1.0 | rectangular |
| 3 | 84 | 1.0 | rectangular |
| 4 | 95 | 1.0 | rectangular |
| 5 | 42 | 1.0 | rectangular |
| 6 | 90 | 1.0 | rectangular |
| 7 | 88 | 1.0 | rectangular |
| 8 | 90 | 1.0 | rectangular |
| 9 | 86 | 1.0 | rectangular |
| 10 | 96 | 1.0 | rectangular |

TABLE 6

| Comparative Example | Sensitivity $E_{OD}$ (mJ/cm$^2$) | Resolution ($\mu$m) | Profile |
|---|---|---|---|
| 1 | 25 | 1.0 | rounded |
| 2 | 25 | 1.0 | rounded, T-top |
| 3 | 650 | 1.5 | positive taper |

Japanese Patent Application No. 2000-115737 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist film having a thickness of 3 to 50 $\mu$m, comprising:
   (A) 80 parts by weight of an alkali-insoluble or substantially insoluble polymer having acidic functional groups protected with acid labile groups, which polymer becomes alkali-soluble upon elimination of the acid-labile groups;
   (B) 0.5 to 15 parts by weight of a photoacid generator selected from the group consisting of oxime sulfonate compounds, onium salts, β-ketosulfone derivatives, diazomethane derivatives, disulfone derivatives, sulfonic acid ester derivatives and imidoyl sulfonate derivatives; and
   (C) 0.1 to 15 parts by weight of a 1,2-naphthoquinonediazidosulfonyl group-bearing compound.

2. The resist film of claim 1, wherein the polymer (A) contains recurring units of general formula (1) below and has a weight-average molecular weight of 3,000 to 300,000, $$-(CH_2-CR^1)-\phantom{XX}(1)$$

(with $R^2_x$ and $(OH)_y$ substituents on the phenyl ring)

wherein $R^1$ is hydrogen or methyl, $R^2$ is a straight, branched or cyclic alkyl of 1 to 8 carbons, and x is 0 or a positive integer and y is a positive integer satisfying $x+y \leq 5$;

in which the hydrogen atoms on some of the phenolic hydroxyl groups have been substituted with at least one type of acid labile group, and the amount of acid labile groups averages more than 0 mol %, but not more than 80 mol %, of all the phenolic hydroxyl group hydrogens in formula (1).

3. A resist film according to claim 2, wherein the amount of acid labile groups is 10 to 50 mole percent.

4. The resist film of claim 1, wherein the photoacid generator (B) is an oxime sulfonate compound.

5. The resist film of claim 1, further comprising (D) a basic compound.

6. A resist film according to claim 5, wherein the basic compound (D) is a primary, secondary or tertiary aliphatic amine, mixed amine, aromatic amine, heterocyclic amine, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, imide derivatives, or a combination thereof.

7. A resist film according to claim 5, wherein the basic compound (D) is present in an amount 0.01 to 2 parts per 80 parts of the polymer (A).

8. A resist film according to claim 5, wherein the basic compound (D) is present in an amount 0.01 to 1 parts per 80 parts of the polymer (A).

9. The resist film of claim 1, further comprising (E) a dissolution promoter that includes a low polynuclear compound of general formula (2) below having phenolic hydroxyl groups and from 2 to 20 benzene rings, such that the ratio in the number of phenolic hydroxyl groups to the number of benzene rings is from 0.5 to 2.5, (2)

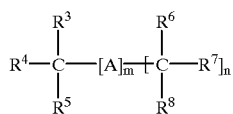

wherein $R^3$ to $R^8$ are each independently hydrogen, methyl, or a group of formula (3) or (4) below; m is an integer from 0 to 2 and n is an integer from 0 to 2, with the proviso that m is 1 or 2 if n is 0; when m is 1 and n is 0, A is hydrogen, methyl or a group of formula (3); when m is 2 and n is 0, one A moiety is methylene or a group of formula (5) below and the other A moiety is hydrogen, methyl or a group of formula (3); when n is 1, A is methylene or a group of formula (5); when m is 1 and n is 2, A is methine or a group of formula (6) below; and when m is 2 and n is 2, one A moiety is methylene or a group of formula (5) and the other A moiety is methine or a group of formula (6);

(3)

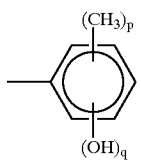

(4)

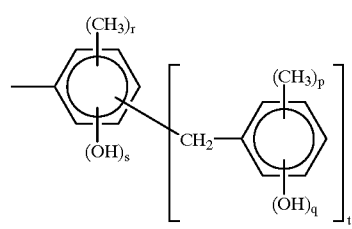

(5)

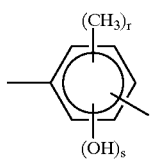

(6)

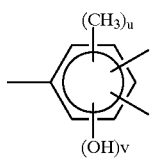

wherein p, q, r, s, t, u and v are each an integer from 0 to 3, such that p+q≦5, r+s≦4 and u+v≦3.

10. A patterning process comprising the steps of:
   (i) producing a resist film of claim 1 on a substrate;
   (ii) heat treating the resist film, then exposing it through a photomask to ultraviolet light having a wavelength of at least 300 nm; and
   (iii) heat treating the exposed resist composition if necessary, then developing it with a developer.

11. A resist film according to claim 1, wherein the photoacid generator (B) is 1 to 8 parts by weight.

12. A resist film according to claim 1, wherein the 1,2-naphthoquinoediazidosulfonyl group-bearing compound is 0.5 to 10 parts per 80 parts of polymer (A).

13. A resist film having a thickness of 3 to 50 µm, comprising:
   (A) an alkali-insoluble or substantially insoluble polymer having acidic functional groups protected with acid labile groups, which polymer becomes alkali-soluble upon elimination of the acid-labile groups;
   (B) a photoacid generator selected from the group consisting of oxime sulfonate compounds, onium salts, β-ketosulfone derivatives, diazomethane derivatives, disulfone derivatives, sulfonic acid ester derivatives and imidoyl sulfonate derivatives; and
   (C) a 1,2-naphthoquinonediazidosulfonyl group-bearing compound.

14. A resist film according to claim 13, wherein (B) is at least one oxime sulfonate compound.

15. A resist film according to claim 13, wherein (B) is α-(4-toluenesulfonyloxyimino)-4-methoxyphenylacetonitrile.

16. A resist film having a thickness of 3 to 50 µm, comprising:
   (A) 80 parts by weight of an alkali-insoluble or substantially insoluble polymer containing recurring units of general formula (1) below and has a weight-average molecular weight of 3,000 to 300,000, (1)

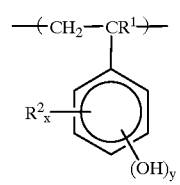

wherein $R^1$ is hydrogen or methyl, $R^2$ is a straight, branched or cyclic alkyl of 1 to 8 carbons, and x is 0 or a positive integer and y is a positive integer satisfying x+y≦5;

in which the hydrogen atoms on some of the phenolic hydroxyl groups have been substituted with at least one type of acid labile group, the amount of acid labile groups averages more than 0 mol %, but not more than 80 mol %, of all the phenolic hydroxyl group hydrogens in formula (1), and the acid labile group is selected from the class consisting of groups of the following general formulas (7) and (8), tertiary alkyl groups, trialkylsilyl groups, and ketoalkyl groups:

(7)

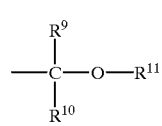

(8)

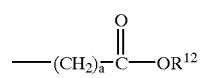

wherein $R^9$ and $R^{10}$ are each independently a hydrogen or a straight or branched alkyl of 1 to 6 carbons, and $R^{11}$ is a straight, branched or cyclic alkyl of 1 to 10 carbons, or a pair of $R^9$ and $R^{10}$, a pair of $R^9$ and $R^{11}$, or a pair of $R^{10}$ and $R^{11}$ may together form a ring, in which case $R^9$, $R^{10}$ and $R^{11}$ are each independently a straight or branched alkylene of 1 to 6 carbons, $R^{12}$ is a tertiary alkyl of 4 to 12 carbons, and the letter a is an integer from 0 to 6;

(B) 0.5 to 15 parts by weight of a photoacid generator selected from the group consisting of oxime sulfonate compounds, onium salts, β-ketosulfone derivatives, diazomethane derivatives, disulfone derivatives, sulfonic acid ester derivatives and imidoyl sulfonate derivatives; and (C) 0.1 to 15 parts by weight of a 1,2-naphthoquinonediazidosulfonyl group-bearing compound.

17. A resist composition for exposure to ultraviolet light having a wavelength of at least 300 nm, comprising:

(A) 80 parts by weight of an alkali-insoluble or substantially insoluble polymer having acidic functional groups protected with acid labile groups, which polymer becomes alkali-soluble upon elimination of the acid-labile groups;

(B) 0.5 to 15 parts by weight of a photoacid generator selected from the group consisting of oxime sulfonate compounds, onium salts, β-ketosolfone derivatives, diazomethane derivatives, disulfone derivatives, sulfonic acid ester derivatives and imidoyl sulfonate derivatives; and (C) 0.1 to 15 parts by weight of a 1,2-napthoquinonediazidosulfonyl group-bearing compound obtained by introducing 1,2-napthoquinonediazidosulfonyl group into a phenolic hydroxyl group-bearing ballast molecule of formula 2, or into a novolac resin comprising recurring units of formula (11) below and having a weight-average molecular weight in a range of 2,000 to 20,000:

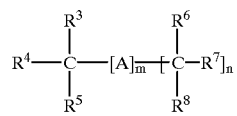

(2)

wherein $R^3$ to $R^8$ are each independently hydrogen, methyl, or a group of formula (3) or (4) below: m is an integer from 0 to 2 and n is an integer from 0 to 2, with the proviso that m is 1 or 2 if n is 0; when m is 1 and n is 0, A is hydrogen, methyl or a group of formula (3); when m is 2 and n is 0, one A moiety is methylene or a group of formula (5) below and the other A moiety is hydrogen, methyl or a group of formula (3); when n is 1, A is methylene or a group of formula (5); when m is 1 and n is 2, A is methane or a group of formula (6) below; and when m is 2 and n is 2, one A moiety is methylene or a group of formula (5) and the other A moiety is methane or a group of formula (6):

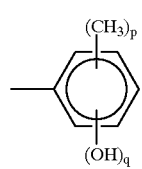

(3)

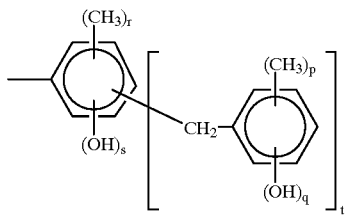

(4)

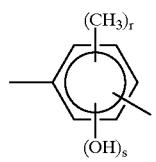

(5)

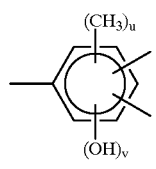

(6)

wherein p, q, r, s, t, u and v are each an integer from 0 to 3, such that p+q≦5, r+s≦4 and u+v≦3,

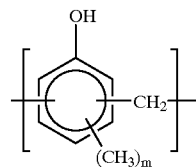

(11)

wherein m is an integer from 0 to 3.

18. A patterning process comprising the steps of
(i) applying onto a substrate a resist composition comprising:
  (A) 80 parts by weight of an alkali-insoluble or substantially insoluble polymer having acidic functional groups protected with acid labile groups, which polymer becomes alkali-soluble upon elimination of the acid-labile groups:
  (B) 0.5 to 15 parts by weight of a photoacid generator selected from the group consisting of oxime sulfonate compounds, onium salts, β-ketosulfone derivatives, diazomethane derivatives, disulfone derivatives, sulfonic acid ester derivatives and imidoyl sulfonate derivatives; and
  (C) 0.1 to 15 parts by weight of a 1,2-napthoquinonediazidosulfonyl group-bearing compound so that a resist film has a thickness of 3 to 50 μm;
(ii) heat treating the resist film at 90 to 130° C. for 1 to 10 minutes, then exposing it through a photomask to ultraviolet light having a wavelength of at least 300 nm; and
(iii) heat treating the exposed resist composition at 90 to 130° C. for 1 to 5 minutes if necessary, then developing it with a developer.

19. A process according to claim 18, wherein the process further comprises:
(iv) conducting a metal plating of copper, gold, Fe, Ni, or Co on the substrate.

20. A process according to claim 18, wherein use of the resist composition results in a sensitivity of 84 to 96 mJ/cm² with a resolution of 1.0 μm.

21. A substrate having applied thereto a resist film, in a thickness of 3 to 50 μm, said resist film comprising:

(A) 80 parts by weight of an alkali-insoluble or substantially insoluble polymer containing recurring units of general formula (1) below and has a weight-average molecular weight of 3,000 to 300,000,

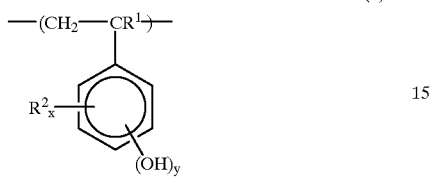

(1)

wherein R¹ is hydrogen or methyl, R² is a straight, branched or cyclic alkyl of 1 to 8 carbons, and x is 0 or a positive integer and y is a positive integer satisfying x+y≦5;

in which the hydrogen atoms on some of the phenolic hydroxyl groups have been substituted with at least one type of acid labile group, the amount of acid labile groups averages more than 0 mol %, but not more than 80 mol %, of all the phenolic hydroxyl group hydrogens in formula (1), and the acid labile group is selected from the class consisting of groups of the following general formulas (7) and (8), tertiary alkyl groups, trialkylsilyl groups, and ketoalkyl groups:

(7)

(8)

wherein R⁹ and R¹⁰ are each independently a hydrogen or a straight or branched alkyl of 1 to 6 carbons, and R¹¹ is a straight, branched or cyclic alkyl of 1 to 10 carbons, or a pair of R⁹ and R¹⁰, a pair of R⁹ and R¹¹, or a pair of R¹⁰ and R¹¹ may together form a ring, in which case R⁹, R¹⁰ and R¹¹ are each independently a straight or branched alkylene of 1 to 6 carbons, R¹² is a tertiary alkyl of 4 to 12 carbons, and the letter a is an integer from 0 to 6;

(B) 0.5 to 15 parts by weight of a photoacid generator selected from the group consisting of oxime sulfonate compounds, onium salts, β-ketosulfone derivatives, diazomethane derivatives, disulfone derivatives, sulfonic acid ester derivatives and imidoyl sulfonate derivatives: and (C) 0.1 to 15 parts by weight of a 1,2-naphthoquinonediazidosulfonyl group-bearing compound.

22. A substrate having applied thereto a resist film, in a thickness of 3 to 50 μm, said resist film comprising:

(A) 80 parts by weight of an alkali-insoluble or substantially insoluble polymer having acidic functional groups protected with acid labile groups, which polymer becomes alkali-soluble upon elimination of the acid-labile groups;

(B) 0.5 to 15 parts by weight of a photoacid generator selected from the group consisting of oxime sulfonate compounds, onium salts, β-ketosolfone derivatives, diazomethane derivatives, disulfone derivatives, sulfonic acid ester derivatives and imidoyl sulfonate derivatives; and (C) 0.1 to 15 parts by weight of a 1,2-napthoquinonediazidosulfonyl group-bearing compound obtained by introducing 1,2-napthoquinonediazidosulfonyl group into a phenolic hydroxyl group-bearing ballast molecule of formula 2, or into a novolac resin comprising recurring units of formula (11) below and having a weight-average molecular weight in a range of 2,000 to 20,000:

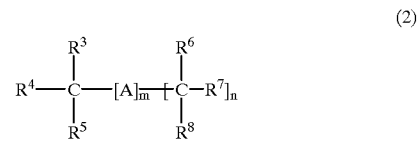

(2)

wherein R³ to R⁸ are each independently hydrogen, methyl, or a group of formula (3) or (4) below: m is an integer from 0 to 2 and n is an integer from 0 to 2, with the proviso that m is 1 or 2 if n is 0; when m is 1 and n is 0, A is hydrogen, methyl or a group of formula (3); when m is 2 and n is 0, one A moiety is methylene or a group of formula (5) below and the other A moiety is hydrogen, methyl or a group of formula (3); when n is 1, A is methylene or a group of formula (5); when m is 1 and n is 2, A is methane or a group of formula (6) below; and when m is 2 and n is 2, one A moiety is methylene or a group of formula (5) and the other A moiety is methane or a group of formula (6):

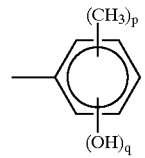

(3)

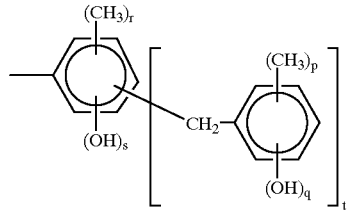

(4)

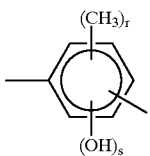

(5)

-continued

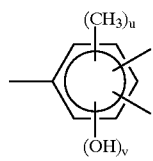
(6)

wherein p, q, r, s, t, u and v are each an integer from 0 to 3, such that p+q≦5, r+s≦4 and u+v≦3,

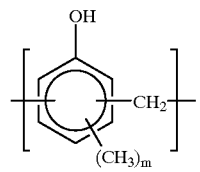
(11)

wherein m is an integer from 0 to 3.

23. A resist composition for exposure to ultraviolet light having a wavelength of at least 300 nm, comprising:

(A) 80 parts by weight of an alkali-insoluble or substantially insoluble polymer having acidic functional groups protected with acid labile groups, which polymer becomes alkali-soluble upon elimination of the acid-labile groups;

(B) 0.5 to 15 parts by weight of a photoacid generator selected from the group consisting of oxime sulfonate compounds, onium salts, β-ketosulfone derivatives, diazomethane derivatives, disulfone derivatives, sulfonic acid ester derivatives and imidoyl sulfonate derivatives; and (C) 0.1 to 15 parts by weight of a 1,2-naphthoquinonediazidosulfonyl group-bearing compound, with the proviso that said naphthoquinonediazidosulfonyl group-bearing compound is not a trihydroxybenzophenone.

* * * * *